United States Patent
Naumann et al.

(10) Patent No.: US 7,834,614 B2
(45) Date of Patent: Nov. 16, 2010

(54) METHOD AND APPARATUS FOR EVALUATING RAPID CHANGES IN CURRENT

(75) Inventors: Michael Naumann, Feucht (DE); Markus Miklis, Pfeifferhütte (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 0 days.

(21) Appl. No.: 12/562,786

(22) Filed: Sep. 18, 2009

(65) Prior Publication Data

US 2010/0007332 A1    Jan. 14, 2010

Related U.S. Application Data

(63) Continuation of application No. PCT/EP2008/000497, filed on Jan. 23, 2008.

(30) Foreign Application Priority Data

Mar. 22, 2007    (DE) ........................ 10 2007 013 712

(51) Int. Cl.
     *G01R 15/18*      (2006.01)
(52) U.S. Cl. .................... 324/127; 324/117 R
(58) Field of Classification Search .................. 324/96, 324/98, 117 R, 117 H, 126–127; 702/58, 702/64; 361/42
See application file for complete search history.

(56) References Cited

U.S. PATENT DOCUMENTS

| | | | |
|---|---|---|---|
| 5,208,542 A * | 5/1993 | Tennies et al. | ............... 324/544 |
| 5,706,159 A | 1/1998 | Dollar, II et al. | |
| 5,729,145 A | 3/1998 | Blades | |
| 5,815,352 A | 9/1998 | Mackenzie | |
| 5,839,092 A * | 11/1998 | Erger et al. | ................... 702/58 |
| 6,259,996 B1 | 7/2001 | Haun et al. | |
| 6,414,829 B1 | 7/2002 | Haun et al. | |
| 6,577,484 B1 | 6/2003 | Macbeth et al. | |
| 6,625,550 B1 | 9/2003 | Scott et al. | |
| 2004/0156153 A1 | 8/2004 | Csanky et al. | |

FOREIGN PATENT DOCUMENTS

| | | |
|---|---|---|
| DE | 202004005495 U1 | 8/2005 |
| WO | 9630988 A1 | 10/1996 |
| WO | 9635250 A1 | 11/1996 |
| WO | 9943065 A1 | 8/1999 |
| WO | 2005098458 A1 | 10/2005 |

OTHER PUBLICATIONS

International Search Report dated Jun. 24, 2008.

* cited by examiner

*Primary Examiner*—Ha Tran T Nguyen
*Assistant Examiner*—Arleen M Vazquez
(74) *Attorney, Agent, or Firm*—Laurence A. Greenberg; Werner H. Stemer; Ralph E. Locher

(57) ABSTRACT

In order to detect and evaluate changes in current as a result of electric arcs, a sensor signal, differentiated on the basis of time, is produced with a sensor-dependent frequency bandwidth whose upper cutoff frequency is 40 MHz and whose lower cutoff frequency is 100 kHz. The sensor signal is taken and an evaluation signal is produced with an upper cutoff frequency of less than or equal to 10 MHz. The evaluation signal is compared with a threshold value and a normalized signal is produced, and a pulse duration of the signal is extended to a prescribed time value.

15 Claims, 2 Drawing Sheets

METHOD AND APPARATUS FOR EVALUATING RAPID CHANGES IN CURRENT

CROSS-REFERENCE TO RELATED APPLICATION

This is a continuation, under 35 U.S.C. §120, of copending international application No. PCT/EP2008/000497, filed Jan. 23, 2008, which designated the United States; this application also claims the priority, under 35 U.S.C. §119, of German patent application No. DE 10 2007 013 712.7, filed Mar. 22, 2007; the prior applications are herewith incorporated by reference in their entirety.

BACKGROUND OF THE INVENTION

Field of the Invention

The invention relates to a method and an apparatus for evaluating sensor-detected rapid changes in current as a result of electric arcs.

To measure an electric current which changes over time, particularly with steep-edged, rapid changes in current, it is known practice from international patent disclosure WO 2005/098458 A1 to use a sensor with a ferromagnetic coupling element and with a secondary or sensor winding which surrounds the latter and also with a primary or exciter winder which carries the current whose rapid changes in current need to be detected. At the connection ends of the sensor winding, it is possible to tap off a current or voltage signal which results from the change in gradient ($d^2I_p/dt^2$) as a result of high-frequency signal components in the current signal and from the attenuation (gain) as a result of the coupling of the sensor winding to the exciter winding by the ferromagnetic coupling element. This signal is sampled using an analog/digital converter. The known sensor, which does not perform proportional current measurement but rather detects changes in the current level in a particular frequency range, can be used to detect events as a result of electric arcs with a little complexity.

SUMMARY OF THE INVENTION

It is accordingly an object of the invention to provide a method and an apparatus for evaluating rapid changes in current, which overcomes the above-mentioned disadvantages of the prior art devices and methods of this general type, which evaluates sensor-detected rapid changes in current as a result of electric arcs.

With the foregoing and other objects in view there is provided, in accordance with the invention, a method for detecting and evaluating changes in current as a result of electric arcs. The method includes the steps of producing a sensor signal differentiated on a basis of time with a sensor-dependent frequency bandwidth having an upper cutoff frequency being $f_{go1} \leq 40$ MHz and a lower cutoff frequency being $f_{gu} \geq 100$ kHz; producing an evaluation signal with an upper cutoff frequency of 1 MHz $\leq f_{go2} \leq 10$ MHz from the sensor signal; producing a normalized pulsed signal from the evaluation signal; and extending a pulse duration of the normalized pulsed signal to a prescribed time value.

For the purpose of detecting and evaluating changes in current as a result of electric arcs, the method according to the invention provides for a processable evaluation signal to be produced from a time-differentiated and bandpass-filtered sensor signal. The sensor-dependent bandwidth of the sensor signal is between the upper cutoff frequency of 40 MHz and the lower cutoff frequency of 100 kHz. This differentiated evaluation or sensor signal (differentiated on the basis of time) is then frequency-filtered. An appropriate evaluation signal with an upper cutoff frequency preferably lower than 10 MHz is digitized using a voltage-based threshold value comparison.

The signal produced in this case, which is subsequently also called the pulsed signal, with a normalized signal level (amplitude) has its pulse duration extended to a prescribed time value, particularly to 100 μs. Preferably, the pulse duration of a single signal pulse is extended, and the signal pulse is therefore evaluated and/or processed further, only when a plurality of successive signal pulses (impulses) are counted within the time window. In this case, the time value of the pulse extension is expediently set to the processing time or speed of a microprocessor or microcontroller suitably used for signal evaluation.

In line with one preferred variant of the method, not only is the signal level normalized but also the duration or pulse duration of the still unextended signal is normalized to a prescribed time value. Next, successive normalized pulsed signals are expediently counted within a prescribed time window, particularly with a time interval of 10 μs.

In line with the invention, an apparatus which is particularly suitable for carrying out the method has, in addition to a current sensor which is suitable for detecting rapid changes in current and which is preferably as space-saving as possible, an evaluation electronics unit for signal processing which is connected to the current sensor. The evaluation electronics unit is provided and set up for the purpose of transforming the frequency-dependent sensor signal which can be tapped off from the sensor winding of the sensor into digital signals, counting the signals and then extending the pulse duration of the signal or signal pulse to a prescribed time value.

A normalization element which is connected downstream of an analog/digital converter in the evaluation electronics unit in one advantageous refinement is used for signal normalization over time. In addition, the evaluation electronics unit expediently has a counter for detecting the number of pulsed signals and/or signal pulses. Also, the evaluation electronics unit suitably has a sample-and-hold circuit for extending the pulse duration of the pulsed signal.

The advantages attained with the invention are, in particular, that direct arc recognition with a high level of interference immunity is rendered possible with a simultaneously small physical volume and low power consumption and low computation power in the detection and evaluation system.

Other features which are considered as characteristic for the invention are set forth in the appended claims.

Although the invention is illustrated and described herein as embodied in a method and an apparatus for evaluating rapid changes in current, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
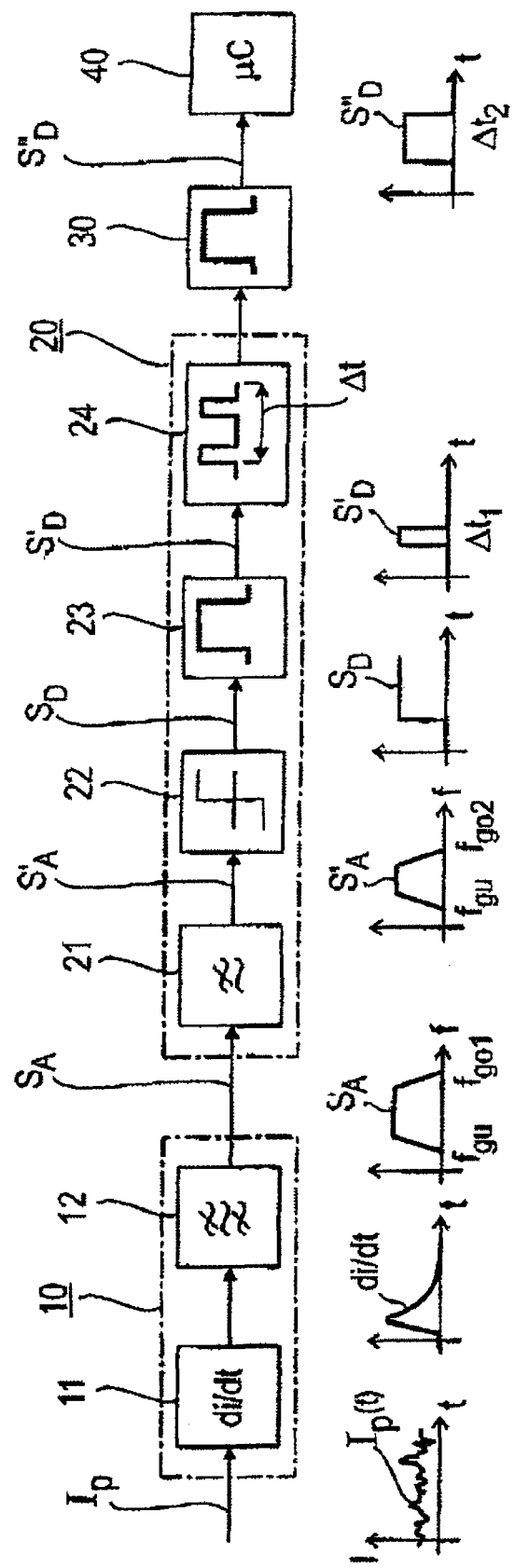
FIG. 1 is a schematic diagram showing a response of an apparatus for detecting and evaluating changes in current with a sensor module and also with an evaluation electronics unit for processing the signals illustrated in graphs according to the invention.

Corresponding parts have been provided with the same reference symbols in both figures. Referring now to the drawings of the invention in detail, and first in particular to FIG. 1 thereof, there is shown a block diagram used to show the fundamental modules of an apparatus for detecting and evaluating changes in current as a result of electric arcs with a sensor module 10 and an evaluation electronics unit 20 for signal processing and also with a functional module 30 for further signal processing and with a microcontroller 40 for signal analysis. The sensor module 10, which is subsequently also called the current sensor, contains the functional elements of a time-based current differentiator (differentiation function di/dt) 11 and of a bandpass filter (bandpass function) 12.

The evaluation electronics unit 20 contains, at its input, a low pass filter 21 and, connected downstream thereof, an analog/digital converter (AD converter) in the form of preferably a comparator or 1-bit converter 22 which has a normalization element 23 connected downstream of it. The normalization element 23 in turn has a functional module 24 for time analysis, for example a counter, connected downstream of it. The functional module 30 is expediently integrated in a microprocessor, for example in the microcontroller 40.

The graphs shown beneath the block diagram illustrate the respective signals at the input and the output and also the transfer function of the relevant function blocks or functional modules. Thus, the left-hand graph in FIG. 1 shows the current signal $I_P$ to be detected and evaluated, whose changeover time (di/dt) 11 is detected by the sensor 10. The associated bandpass function 12 has an upper cutoff frequency $f_{go1}$, preferably at $f_{go1}=40$ MHz, and a lower cutoff frequency $f_{gu}$, preferably at $f_{gu}=100$ kHz.

The time-differentiated and bandpass-filtered sensor signal $S_A$ which can be tapped off from the output of the sensor 10 is frequency-filtered by the evaluation electronics unit 20 in the low pass filter 21 provided at the input thereof. In this case, the low pass filter 21 has an upper cutoff frequency $f_{go2}$, where $f_{go2}<10$ MHz, preferably $f_{go2}<5$ MHz. The low-pass-filtered sensor or evaluation signal $S'_A$ is digitized by the downstream A/D converter 22. The digital signal $S_D$ has its signal level U normalized, at typically U=5 V. This threshold value can be adjusted in the mV range in order to ensure safe detection of the exaggerated arc signals.

In the downstream normalization element 23, the pulse duration or pulse length of the pulsed signal is normalized over time to a time value of $\Delta t_2 \ll \Delta t$. The downstream counter 24 counts the signal pulses from the normalization element 23. If two time-normalized impulses or pulsed signals $S'_D$ are recognized within a set time window of $\Delta t=10$ µs, for example, an individual pulsed signal or an individual signal pulse (single impulse) is forwarded to the functional module 30 for signal extension. Otherwise, detected or recognized pulsed signals $S'_D$, i.e. appropriate single impulses, are ignored.

The functional module 30 essentially contains what is known as a sample-and-hold circuit which extends the forwarded single impulse in the pulsed signal $S'_D$ to a pulse duration of $\Delta t_2 \gg \Delta t_1$. As a result, a microcontroller 40 connected downstream of the functional module 30 is left sufficient time to recognize the extended pulsed signal $S''_D$. The microcontroller 40 accordingly receives only information that a plurality of single impulses or a signal $S_A$ at a frequency of between 100 kHz and 4 MHz have occurred within the past pulse duration of $\Delta t_2$. If, by contrast, a constant frequency greater than 100 kHz is applied for a comparatively long period of time, the functional module 30 merely supplies a High level to the microprocessor 40. A permanent High level of this kind is recognized not to be attributable to an electric arc, however.

Figure 2:
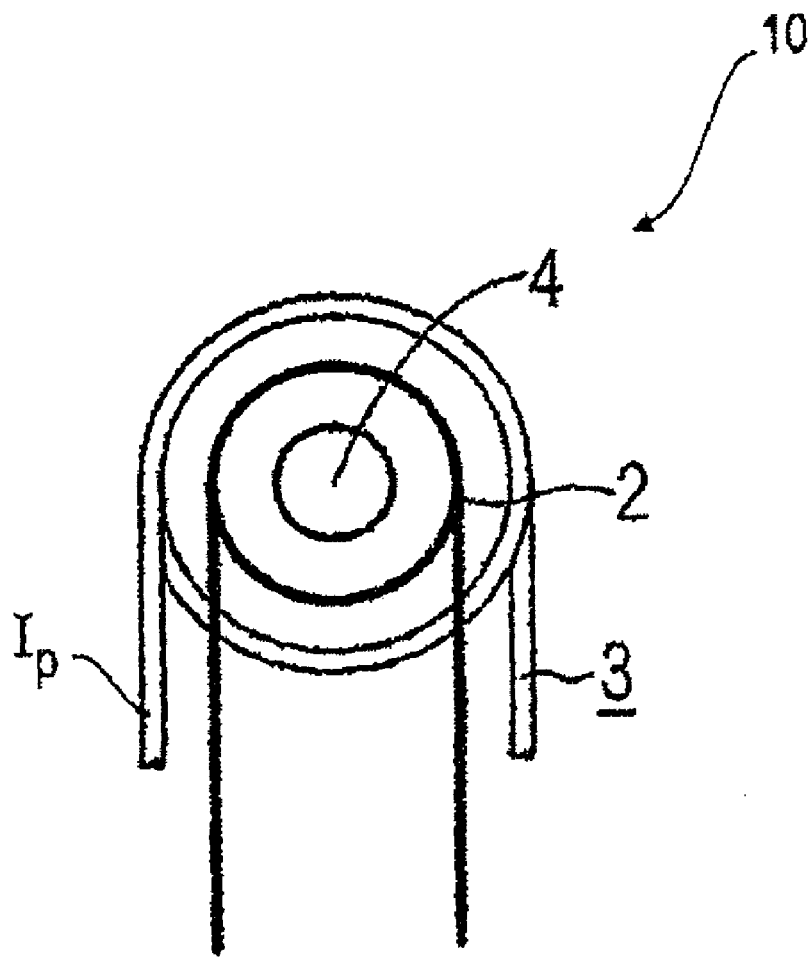
FIG. 2 is an illustration showing a suitable current sensor for detecting rapid changes in current.

As FIG. 2 shows, the current sensor 10 is constructed from a sensor winding or sensor coil 2 which, together with an exciter winding 3, is wound around a common coupling element 4. In this arrangement, the exciter winding 3 is situated above the sensor winding 2, which in turn surrounds the coupling element 4. The ferromagnetic coupling element 4, which is cylindrical or rod-shaped, penetrates both windings 2, 3 integrally. In this case, the sensor winding 2, containing a plurality of sensor turns, and the exciter winder 3, which may likewise contain a plurality of turns, are mounted on the coupling element 4 so as to be DC-isolated from one another.

The coupling element 4 and the two windings 2, 3 and also the evaluation electronics unit 20, the functional module 30 and/or the microcontroller 40 are preferably arranged in a housing, which may also be that of a circuit breaker or circuit breaker relay.

The invention claimed is:

1. A method for detecting and evaluating changes in current as a result of electric arcs, which comprises the steps of:
    producing a sensor signal differentiated on a basis of time with a sensor-dependent frequency bandwidth having an upper cutoff frequency being $f_{go1} \leq 40$ MHz and a lower cutoff frequency being $f_{gu} \geq 100$ kHz;
    producing an evaluation signal with an upper cutoff frequency of 1 MHz $\leq f_{go2} \leq 10$ MHz from the sensor signal;
    producing a normalized pulsed signal from the evaluation signal; and
    extending a pulse duration of the normalized pulsed signal to a prescribed time value.

2. The method according to claim 1, wherein a signal level and the pulse duration of the normalized pulsed signal are normalized to a prescribed time value.

3. The method according to claim 1, which further comprises counting successive normalized pulsed signals within a prescribed time window.

4. The method according to claim 3, which further comprises adjusting the prescribed time window to a time interval in a µs range.

5. The method according to claim 3, which further comprises extending the pulse duration of a single signal pulse in the normalized pulsed signal if at least two signal pulses in the normalized pulsed signal are counted within the prescribed time window.

6. The method according to claim 1, which further comprises extending the pulse duration of the normalized pulsed signal to $\Delta t_2 \gg \Delta t_1$.

7. An apparatus for detecting and evaluating changes in current as a result of electric arcs, the apparatus comprising:

a current sensor having a ferromagnetic coupling element, a sensor winding surrounding said ferromagnetic coupling element, and an exciter winding for carrying the current; and an evaluation electronics unit having an analog/digital converter, said evaluation electronics unit connected to said current sensor and transforms a frequency-dependent sensor signal which can be tapped off directly from said current sensor, including from said exciter winding thereof, into a normalized signal using said analog/digital converter and to extend a pulse duration of the normalized signal to a prescribed time value.

8. The apparatus according to claim 7, wherein said exciter winding of said current sensor surrounds said ferromagnetic coupling element at a distance from said sensor winding and disposed above said sensor winding.

9. The apparatus according to claim 7, wherein said current sensor is operative as a time differentiation element and as a bandpass filter having a band frequency of between 100 kHz and 40 MHz.

10. The apparatus according to claim 7, wherein said evaluation electronics unit has, at its input, a low pass filter which is connected upstream of said analog/digital converter and which has a cutoff frequency of 1 MHz to 10 MHz.

11. The apparatus according to claim 7, wherein said evaluation electronics unit has a normalization element connected downstream of said analog/digital converter for normalizing the normalized signal over time.

12. The apparatus according to claim 7, wherein said evaluation electronics unit has a counter module for detecting a number of signal pulses in the signal.

13. The apparatus according to claim 7, further comprising a functional module for signal processing connected downstream of said evaluation electronics unit and having a sample-and-hold circuit for extending the pulse duration of the normalized signal to the prescribed time value.

14. The apparatus according to claim 7, wherein said analog/digital converter is selected from the group consisting of comparators and 1-bit converters.

15. The apparatus according to claim 13, further comprising:
a microcontroller connected downstream of said functional module; and
a common housing, at least two of said current sensor, said evaluation electronics unit, said functional module for signal processing and said microcontroller are integrated into said common housing.

* * * * *